US008373262B2

(12) United States Patent
Katoh

(10) Patent No.: US 8,373,262 B2
(45) Date of Patent: Feb. 12, 2013

(54) SOURCE DRIVER, METHOD FOR MANUFACTURING SAME, AND LIQUID CRYSTAL MODULE

(75) Inventor: Tatsuya Katoh, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 264 days.

(21) Appl. No.: 12/734,844

(22) PCT Filed: Nov. 27, 2008

(86) PCT No.: PCT/JP2008/071539
§ 371 (c)(1),
(2), (4) Date: Aug. 2, 2010

(87) PCT Pub. No.: WO2009/069696
PCT Pub. Date: Jun. 4, 2009

(65) Prior Publication Data
US 2010/0302474 A1      Dec. 2, 2010

(30) Foreign Application Priority Data

Nov. 30, 2007    (JP) ................. 2007-311627

(51) Int. Cl.
*H01L 23/48*      (2006.01)
(52) U.S. Cl. ............... 257/690; 257/692; 257/E21.627; 257/E21.641; 438/111
(58) Field of Classification Search .......... 257/668, 257/E21.499, E23.031, 690, 692, E21.641, 257/E21.627; 438/111
See application file for complete search history.

(56) References Cited

U.S. PATENT DOCUMENTS

| 6,184,965 | B1 | 2/2001 | Murayama et al. |
| 2002/0012079 | A1 | 1/2002 | Kim et al. |
| 2003/0058230 | A1 | 3/2003 | Ide |
| 2004/0008292 | A1 | 1/2004 | Kim et al. |
| 2005/0007510 | A1 | 1/2005 | Kim et al. |
| 2007/0121022 | A1 | 5/2007 | Kim et al. |
| 2007/0126090 | A1 | 6/2007 | Sasaki et al. |
| 2009/0161057 | A1 | 6/2009 | Kim et al. |

FOREIGN PATENT DOCUMENTS

| JP | 7245324 A | 9/1995 |
| JP | 2002116451 A | 4/2002 |
| JP | 2003108017 A | 4/2003 |
| JP | 2003289087 A | 10/2003 |
| JP | 2004111996 A | 4/2004 |
| JP | 2005109254 A | 4/2005 |
| JP | 2007158001 A | 6/2007 |

OTHER PUBLICATIONS

International Search Report.

*Primary Examiner* — Julio J Maldonado
*Assistant Examiner* — Amar Movva
(74) *Attorney, Agent, or Firm* — Harness, Dickey & Pierce

(57) ABSTRACT

A source driver of a film package type including a film substrate; a semiconductor chip on a surface of the film substrate, the semiconductor chip having a plurality of terminals, the plurality of terminals including input terminals, output terminals, and third terminals; an input terminal wiring region for receiving first wiring lines which are connected to the input terminals; an output terminal wiring region for receiving second wiring lines which are connected to the output terminals; sprocket portions at opposite ends of the film substrate; and a heat conducting patterns for connecting the third terminals. This makes it possible to provide a source driver, a method for manufacturing the source driver, and a liquid crystal module, each of which can increase a heat dissipation amount.

10 Claims, 10 Drawing Sheets

SOURCE DRIVER, METHOD FOR MANUFACTURING SAME, AND LIQUID CRYSTAL MODULE

TECHNICAL FIELD

The present invention relates to a source driver of a film package type, a method for manufacturing the source driver, and a liquid crystal module including the source driver.

BACKGROUND ART

A package in which a semiconductor chip is provided on an insulating film on which a wiring pattern is formed, such as a TCP (Tape Carrier Package) or a COF (Chip on Film), is widely used as a package for an LCD driver which is attached to a liquid crystal panel or the like. Examples of the LCD driver encompass: a source driver for supplying a signal to a source electrode of a transistor provided in a pixel region in a liquid crystal panel; and a gate driver for supplying a signal to a gate electrode of the transistor.

FIG. 7 is a view schematically illustrating an arrangement of a conventional liquid crystal module 500.

The conventional liquid crystal module 500 includes a liquid crystal panel 501, gate drivers 502, source drivers 503, and input substrates 504 (see FIG. 7). A plurality of source drivers 503 are attached to one or two of four sides of the liquid crystal panel 501. A plurality of gate drivers 502 are attached to, among the four sides of the liquid crystal panel 501, one or two sides which are perpendicular to the side(s) to which the plurality of source drivers 503 are attached. The input substrates 504 are provided to be opposite to the liquid crystal panel 501 with respect to the source drivers 503.

In the arrangement, the gate drivers 502 and the source drivers 503 receive a drive signal and a power source from wiring lines provided on the input substrate 504. Thereby, the liquid crystal panel 501 is driven. That is, in the liquid crystal module 500, the gate driver 502 receives the drive signal and the power source from the input substrate 504 via the source drivers 503 and the liquid crystal panel 501 (see Patent Literature 1, for example).

FIG. 8 is a view illustrating an arrangement of a conventional source driver 503.

The conventional source driver 503 includes a semiconductor chip 514, and has a region segmented into four regions: an input terminal wiring region 511 in which wiring lines are provided so as to be connected to input terminals of the semiconductor chip 514, respectively; an output terminal wiring region 512 in which wiring lines are provided so as to be connected to output terminals of the semiconductor chip 514, respectively; and two through wiring regions 513.

The following description explains how to manufacture the source driver 503. First, a long carrier tape is subjected to a series of manufacturing processes. The long carrier tape has sprocket portions 515, each of which has a string of holes. The sprocket portions are provided at ends of the long carrier tape, which ends face each other in a width direction. After the manufacturing processes, parts which are to be the source drivers 503 are cut out. Thus, individual source drivers 503 are manufactured (see FIG. 9). The sprocket portions 515 are used as carrier members of the long carrier tape. The sprocket portions are used when the long carrier tape is reeled in/out. A user uses only the cut out part of the long carrier tape, as the source driver 503. The other parts of the long carrier tape, such as the sprocket portions 515, are discarded.

The source driver 503 is attached to the liquid crystal panel such that the output terminal wiring region 512 extends toward the liquid crystal panel 501 (see FIG. 10). The input terminals of the semiconductor chip 514 and wiring lines of the input substrates 504 are connected to each other, respectively, via the wiring lines of the input terminal wiring region 511. The output terminals of the semiconductor chip 514 and wiring lines of the liquid crystal panel 501 are connected to each other, respectively, via the wiring lines of the output terminal wiring region 512.

Wiring lines for supplying a signal and the power source to the gate drivers 502 are provided in each of the through wiring regions 513. The gate driver 502 is driven by the signal received from the input substrate 504 via the through wiring region 513 of the source driver 503 (see an arrow X). That is, the through wiring region 513 of the source driver 503 is provided to supply a drive signal and the power source to the gate driver 502.

The plurality of source drivers 503 are attached to the single liquid crystal panel 501, as described above. However, only through wiring regions 513 of two source drivers provided at both ends of the side of the liquid crystal panel 501 are in use for the purpose described above (see FIG. 7). The through wiring regions 513 of the other source drivers 503 are out of use. For example, in FIG. 10, a left through wiring region 513 of a source driver 503a is in use, but a right through wiring region 513 of the source driver 503a, and both through wiring regions 513 of a source driver 503b are out of use.

The semiconductor chip 514 of the source driver 503 generates heat. Such heat is (i) dissipated from the semiconductor chip 514 itself, (ii) dissipated from the wiring lines themselves provided in the input terminal wiring region 511, (iii) led toward the input substrate 504 via the wiring lines provided in the input terminal wiring region 511, (iv) dissipated from the wiring lines themselves provided in the output terminal wiring region 512, and (v) led toward the liquid crystal panel 501 via the wiring lines provided in the output terminal wiring region 512.

CITATION LIST

Patent Literature 1

Japanese Patent Application Publication, Tokukai, No. 2002-116451 A (Publication Date: Apr. 19, 2002)

SUMMARY OF INVENTION

In recent years, a TV has been developed to have high functions and multi-outputs. Such developments cause an increase in heat generation by the semiconductor chip 514 provided on the source driver 503. Because of such an increase, the heat generation by the semiconductor chip 514 is becoming a more serious problem than before. For this reason, there has been demand for a source driver which can dissipate the heat more efficiently.

The present invention is made in view of the conventional problem. An object of the present invention is to provide: source driver which can have an increase in heat dissipation amount; a method for manufacturing the source driver; and a liquid crystal module including the source driver.

In order to attain the object, a source driver of a film package type, includes: a film substrate; a semiconductor chip provided on a surface of the film substrate, the semiconductor chip having a plurality of terminals each of which is connectable to an external member, the plurality of terminals including first terminals for receiving an electric signal, second terminals for outputting an electric signal, and third terminals; first wiring lines provided on the surface of the film substrate, the first wiring lines being connected to the first terminals, respectively; second wiring lines provided on the surface of the film substrate, the second wiring lines being connected to the second terminals, respectively; and sprocket portions provided at opposite sides of the film substrate, respectively, each of the sprocket portions having a metal portion on the film substrate, and a string of holes, each of the first wiring lines being provided such that one end thereof is connected to the first terminal, and the other end thereof extends to a side where no sprocket portion is provided, each of the second wiring lines being provided such that one end thereof is connected to the second terminal, and the other end thereof extends to a side opposite to said side to which the other end of each of the first wiring lines extends, the source driver further including: third wiring lines for connecting the third terminals, each of which is connected to neither any one of the first wiring lines nor any one of the second wiring lines, to the metal portions of the sprocket portions, respectively, the third wiring lines being provided on the surface of the film substrate.

According to the arrangement, the third wiring lines are provided on the surface of the film substrate. The metal portions of the sprocket portions and the third terminals of the semiconductor chip are connected via the third lines, respectively, which third terminals are connected to neither any of the first wiring lines nor any one of the second wiring lines. Therefore, the heat generated by the semiconductor chip can be dissipated from the third wiring lines themselves, and also can be led to the sprocket portions via the third wiring lines. Accordingly, it becomes possible to increase a heat dissipation amount.

Further, according to a conventional arrangement, the sprocket portions are used only when the source driver is being manufactured. For example, a gear is fitted into a string of holes of each of the sprocket portions so that the source driver can be reeled in/out in a manufacturing process. Then, the source driver is cut out, and the sprocket portions are discarded. Furthermore, wiring lines for supplying a drive signal are provided on the source driver. The source driver is attached to the liquid crystal panel, and the gate driver receives the drive signal via the wiring lines.

Meanwhile, according to the arrangement described above, the metal portions of the sprocket portions are connected to the third wiring lines, so that the sprocket portions are used to dissipate the heat. In other words, the sprocket portions are not cut off but left. Here, the wiring lines which are conventionally provided are not provided in the present invention. Therefore, it becomes possible to form the sprocket portions closer to an inner side by virtue of absence of the wiring lines. This can reduce a width of the source driver, and also reduce cost of materials. Alternatively, instead of forming the sprocket portions closer to the inner side by virtue of the absence of the wiring lines, it is possible to allow the first wiring lines and the second wiring lines to be rough-pitched.

In the source driver of the present invention, each of the sprocket portions is preferably such a heat dissipating body that copper or stainless steel is provided on the surface of the film substrate. This allows the third wiring lines themselves to dissipate the heat, and also allows the sprocket portions to efficiently dissipate the heat conducted via the third wiring lines. Therefore, it becomes possible to increase the heat dissipation amount.

In the source driver of the present invention, the third wiring lines are preferably provided over a whole region between outermost first wiring lines among the first wiring lines and outermost second wiring lines among the second wiring lines such that the third wiring lines are electrically insulated from the outermost first wiring lines and the outermost second wiring lines. This increases an area for dissipating the heat generated by the semiconductor chip and an area for conducting the heat. Therefore, it becomes possible to increase the heat dissipation amount. Further, in the source driver of the present invention, the metal portions of the sprocket portions and the third wiring lines are preferably integral with each other.

In the source driver of the present invention, a direction in which each of the outermost first wiring lines extends to be connected to the first terminal of the semiconductor chip is preferably substantially perpendicular to a direction in which each of the outermost second wiring lines extends to be connected to the second terminal of the semiconductor chip.

According to the arrangement, it is possible to cause the region between the outermost first wiring lines and the outermost second wiring lines to be larger. Therefore, by providing heat dissipation patterns, it becomes possible to have a larger area for dissipating the heat generated by the semiconductor chip. Accordingly, the heat can be efficiently dissipated.

The source driver of the present invention preferably further includes a metal plate on an upper surface of the semiconductor chip, the metal plate having suspender leads, and the suspender leads are preferably connected to the third wiring lines, respectively. This allows the heat to be efficiently dissipated even from the upper side of the semiconductor chip. Therefore, it becomes possible to increase the heat dissipation amount.

In the source driver of the present invention, the source driver is preferably manufactured in such a manner that (i) source drivers are prepared as a long carrier tape having the sprocket portions at opposite sides of the long carrier tape, respectively, the opposite sides facing each other in a width direction of the long carrier tape, and then (ii) the long carrier tape is cut in the width direction so as to be divided into individual source drivers. According to the arrangement, the source drivers are obtained by only cutting the long carrier tape in the width direction. Therefore, it is possible to reduce cost of a metallic mold.

A method of the present invention, for manufacturing a source driver of a film package type, the source driver including: a film substrate; a semiconductor chip on provided a surface of the film substrate, the semiconductor chip having a plurality of terminals each of which is connectable to an external member, the plurality of terminals including first terminals for receiving an electric signal, second terminals for outputting an electric signal, and third terminals; first wiring lines provided on the surface of the film substrate, the first wiring lines being connected to the first terminals, respectively; and second wiring lines provided on the surface of the film substrate, the second wiring lines being connected to the second terminals, respectively, includes: (a) providing the following (i) through (iv) at one time, on a surface of a long carrier tape-shaped film substrate, and repeating the providing continuously: (i) the first wiring lines such that one end of each of the first wiring lines extends in a longitudinal direction of the long carrier tape-shaped film substrate, which end is not to be connected to the first terminal; (ii) the second wiring lines such that one end of each of the second wiring lines extends in a direction opposite to the longitudinal direction, which end is not to be connected to the second terminal; (iii) metal portions at both sides of the surface of the long carrier tape-shaped film substrate; and (iv) third wiring lines for connecting third terminals of the semiconductor chip to the metal portions, the third terminals being connected to neither any one of the first wiring lines nor any one of the second wiring lines; (b) providing the semiconductor chip so that the semiconductor chip is connected to the first wiring lines and the second wiring lines, and repeating the providing continuously; and (c) cutting the long carrier tape-shaped film substrate in the width direction so as to divide the long carrier tape-shaped film into individual source drivers.

According to the arrangement, the third wiring lines are provided on the surface of the film substrate. The metal portions and the terminals of the semiconductor chip are connected via the third wiring lines, respectively, which terminals are connected to neither any of the first wiring lines nor any one of the second wiring lines. Therefore, the heat generated by the semiconductor chip can be dissipated from the third wiring lines themselves, and can be led to the metal portions via the third wiring lines. Accordingly, it becomes possible to increase the heat dissipation amount.

Further, according to the conventional arrangement, portions at opposite ends of the film substrate in the width direction, which portions have the metal portions respectively, are used as the sprocket portions, for example. The sprocket portions are used only when the source driver is being manufactured. A gear is fitted into a string of holes of each of the sprocket portions so that the source driver can be reeled in/out in a manufacturing process. Then, the source driver is cut out, and the sprocket portions are discarded. Further, wiring lines for supplying a drive signal are provided on the source driver. The source driver is attached to the liquid crystal panel, and the gate driver receives a drive signal via the wiring lines.

Meanwhile, according to the arrangement described above, the film substrate on which the source drivers are formed continuously is cut in the width direction of the film substrate, so as to be divided into individual source drivers. That is, the metal portions are not cut off but left. The metal portions are connected to the third wiring lines, so as to be used to dissipate the heat. Here, the wiring lines which are conventionally provided are not provided in the present invention. Therefore, it becomes possible to form the metal portions closer to the inner side by virtue of absence of the wiring lines. This can reduce a width of the source driver, and also reduce cost of materials. Alternatively, instead of forming the metal portions closer to the inner side by virtue of the absence of the wiring lines, it is possible to allow the first wiring lines and the second wiring lines to be rough-pitched.

In the method of the present invention, for manufacturing a source driver, a metal plate having suspender leads is preferably provided on one of surfaces of the semiconductor chip, and said step (b) preferably includes: providing the semiconductor chip on the surface of the film substrate such that said one of surfaces is provided as an upper surface; and then connecting the suspender leads to the third wiring lines, respectively. This allows the heat to be efficiently dissipated even from the upper surface of the semiconductor chip. Accordingly, it becomes possible to increase the heat dissipation amount.

A liquid crystal module of the present invention includes: a liquid crystal panel; a plurality of source drivers each of which is described above, the plurality of source drivers being attached to one side or two sides facing each other, among four sides of the liquid crystal panel; a plurality of gate drivers attached to one side or two sides perpendicular to said one side or two sides facing each other, to which the plurality of source drivers are attached, among the four sides of the liquid crystal panel; a substrate or substrates connected to the plurality of source drivers; and a wiring tape or wiring tapes for connecting the liquid crystal panel to the substrate or substrates, the wiring tape or wiring tapes being provided at an end or ends of the side or two sides to which the plurality of source drivers are attached, the wiring tape or wiring tapes being provided closer to the one side or two sides to which the plurality of the gate drivers are provided, than the plurality of source drivers.

According to the arrangement, it becomes possible to lead the heat generated by the semiconductor chip of the source driver to the liquid crystal panel and the input substrate via the third wiring lines and the sprocket portions. Therefore, it becomes possible to realize a liquid crystal module which is advantageous in heat dissipation property.

Further, according to the conventional arrangement, the gate driver receives a drive signal from the substrate via the wiring lines provided on the source driver. However, according to the arrangement described above, it becomes possible to supply a drive signal from the substrate to the gate driver via the wiring tape. Therefore, absence of the wiring lines in the source driver has no influence on the liquid crystal module, which wiring lines are used to supply a drive signal to the gate driver. Further, although the number of components of the liquid crystal module is increased due to the addition of the wiring tapes, it is possible to have a reduction in total cost of the liquid crystal module by virtue of a reduction in cost of the source drivers.

As described above, a source driver of a film package type of the present invention, includes: a film substrate; a semiconductor chip provided on a surface of the film substrate, the semiconductor chip having a plurality of terminals each of which is connectable to an external member, the plurality of terminals including first terminals for receiving an electric signal, second terminals for outputting an electric signal, and third terminals; first wiring lines provided on the surface of the film substrate, the first wiring lines being connected to the first terminals, respectively; second wiring lines provided on the surface of the film substrate, the second wiring lines being connected to the second terminals, respectively; and sprocket portions provided at opposite sides of the film substrate, respectively, each of the sprocket portions having a metal portion on the film substrate, and a string of holes, each of the first wiring lines being provided such that one end thereof is connected to the first terminal, and the other end thereof extends to a side where no sprocket portion is provided, each of the second wiring lines being provided such that one end thereof is connected to the second terminal, and the other end thereof extends to a side opposite to said side to which the end of each of the first wiring lines extends, the source driver further including: third wiring lines for connecting the third terminals, each of which is connected to neither any one of the first wiring lines nor any one of the second wiring lines, to the metal portions of the sprocket portions, respectively, the third wiring lines being provided on the surface of the film substrate.

According to the arrangement, the third wiring lines are provided on the surface of the film substrate. The metal portions of the sprocket portions and the terminals of the semiconductor chip are connected via the third wiring lines, respectively, which terminals are connected to neither any of the first wiring lines nor any one of the second wiring lines. Therefore, the heat generated by the semiconductor chip can be dissipated from the third wiring lines themselves, and also can be led to the sprocket portions via the third wiring lines. Accordingly, it becomes possible to realize a source driver which can have an increase in heat dissipation amount.

Further, the metal portions of the sprocket portions are connected to the third wiring lines, respectively, so that the sprocket portions are used to dissipate the heat. That is, the sprocket portions, which are conventionally discarded, are not cut off but left. Here, the wiring lines are not provided in the present invention, which wiring lines are provided in a conventional arrangement. Therefore, it becomes possible to form the sprocket portions closer to the inner side by virtue of absence of the wiring lines. This can reduce a width of the source driver, and also reduce cost of materials. Alternatively, instead of forming the sprocket portions closer to the inner side by virtue of the absence of the wiring lines, it is possible to allow the first wiring lines and the second wiring lines to be rough-pitched.

Further, a method of the present invention, for manufacturing a source driver of a film package type, the source driver including: a film substrate; a semiconductor chip on a surface of the film substrate, the semiconductor chip having a plurality of terminals each of which is connectable to an external member, the plurality of terminals including first terminals for receiving an electric signal, second terminals for outputting an electric signal, and third terminals; first wiring lines on the film substrate, the first wiring lines being connected to the first terminals, respectively; and second wiring lines on the film substrate, the second wiring lines being connected to the second terminals, respectively, includes: (a) providing the following (i) through (iv) at one time, on a surface of a long carrier tape-shaped film substrate, and repeating the providing continuously: (i) the first wiring lines such that one end of each of the first wiring lines extends in a longitudinal direction of the long carrier tape-shaped film substrate, which end is not to be connected to the first terminal; (ii) the second wiring lines such that one end of each of the second wiring lines extends in a direction opposite to the longitudinal direction, which end is not to be connected to the second terminal; (iii) metal portions at both sides of the surface of the long carrier tape-shaped film substrate; and (iv) third wiring lines for connecting third terminals of the semiconductor chip to the metal portions, the third terminals being connected to neither any one of the first wiring lines nor any one of the second wiring lines; (b) providing the semiconductor chip so that the semiconductor chip is connected to the first wiring lines and the second wiring lines, and repeating the providing continuously; and (c) cutting the long carrier tape-shaped film substrate in the width direction so as to divide the long carrier tape-shaped film into individual source drivers.

According to the arrangement, the third wiring lines are provided on the surface of the film substrate. The metal portions and the terminals of the semiconductor chip are connected via the third wiring lines, respectively, which terminals are connected to neither any of the first wiring lines nor any one of the second wiring lines. Therefore, the heat generated by the semiconductor chip can be dissipated from the third wiring lines themselves, and also can be led to the metal portions via the third wiring lines. Accordingly, it becomes possible to realize a source driver which can have an increase in heat dissipation amount.

Further, the film substrate on which the source drivers are formed continuously is cut in the width direction of the film substrate, so as to be divided into individual source drivers. That is, the metal portions, which are used as the sprocket portions, for example, are not cut off but left. The metal portions are connected to the third wiring lines, respectively, so as to be used to dissipate the heat. Here, the wring lines are not provided in the present invention, which wiring lines are provided in the conventional arrangement. Therefore, it becomes possible to form the metal portions closer to the inner side by virtue of absence of the wiring lines. This can reduce a width of the source driver, and also reduce cost of materials. Alternatively, instead of forming the metal portions closer to the inner side by virtue of the absence of the wiring lines, it is possible to allow the first wiring lines and the second wiring lines to be rough-pitched.

A liquid crystal module of the present invention includes: a liquid crystal panel; a plurality of source drivers each of which is described above, the plurality of source drivers being attached to one side or two sides facing each other, among four sides of the liquid crystal panel; a plurality of gate drivers attached to one side or two sides perpendicular to said one side or two sides facing each other, to which the plurality of source drivers are attached, among the four sides of the liquid crystal panel; a substrate or substrates connected to the plurality of source drivers; and a wiring tape or wiring tapes for connecting the liquid crystal panel to the substrate or substrates, the wiring tape or wiring tapes being provided at an end or ends of the side or two sides to which the plurality of source drivers are attached, the wiring tape or wiring tapes being provided closer to the one side or two sides to which the plurality of the gate drivers are provided, than the plurality of source drivers.

Therefore, the heat generated by the semiconductor chip can be led to the liquid crystal panel and the input substrate via the third wiring lines and the sprocket portions. Accordingly, it is possible to realize a liquid crystal module which is advantageous in heat dissipation property.

Further, according to the conventional arrangement, the gate driver receives a drive signal from the substrate via the wiring lines provided on the source driver. However, according to the present invention, it becomes possible to supply a drive signal from the substrate to the gate driver via the wiring tape. Therefore, absence of the wiring lines in the source driver has no influence on the liquid crystal module, which wiring lines are used to supply a drive signal to the gate driver. Further, although the number of the components of the liquid crystal module is increased due to the addition of the wiring tape, it is possible to have a reduction in total cost of the liquid crystal module by virtue of a reduction in cost of the source drivers.

BRIEF DESCRIPTION OF DRAWINGS

FIG. 1 is a plan view illustrating one embodiment of a source driver of the present invention.

FIG. 2 is a plan view illustrating another embodiment of the source driver of the present invention.

FIG. 3 is a view illustrating manufacturing processes in one embodiment of the source driver of the present invention.

FIG. 4 is a cross-sectional view illustrating further another embodiment of the source driver of the present invention.

FIG. 5 is a plan view illustrating one embodiment of a liquid crystal module of the present invention.

FIG. 6 is an enlarged view illustrating a corner of the liquid crystal module.

FIG. 7 is a plan view illustrating an arrangement of a conventional liquid crystal module.

FIG. 8 is a plan view illustrating an arrangement of a conventional source driver.

FIG. 9 is a view illustrating a process for manufacturing the conventional source driver.

FIG. 10 is an enlarged view illustrating a corner of the conventional liquid crystal module.

Figure 1:
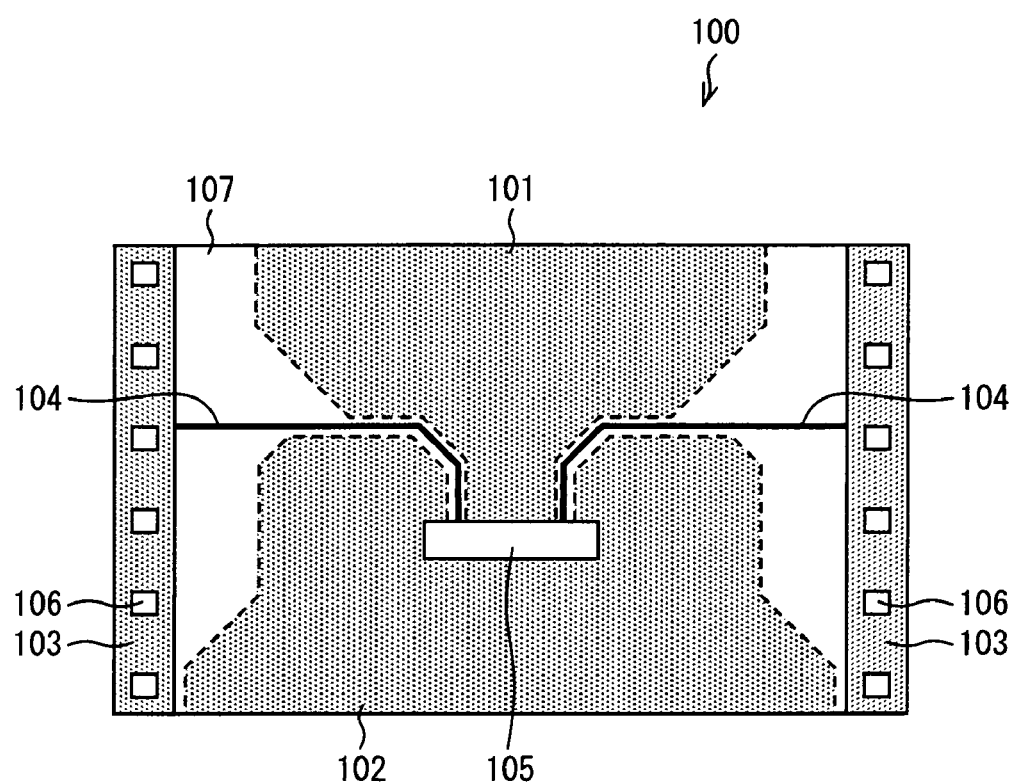
FIG. 1

REFERENCE SIGNS LIST 100, 110, 200. Source driver.
101. Input terminal wiring region (first wiring line)
102, 112. Output terminal wiring region (second wiring line)
103. Sprocket portion
104, 114. Heat conducting pattern (third wiring line)
105. Semiconductor chip
106. Hole
107. Film substrate
201. Heat dissipating material (metal plate)
202. Suspender lead
300. Liquid crystal module
301. Liquid crystal panel
302. Gate driver
303. Wiring tape
304. Input substrate (substrate)

DESCRIPTION OF EMBODIMENTS

Embodiment 1

Arrangement of Source Driver

One embodiment of the present invention is described below with reference to drawings.

FIG. 1 is a view illustrating an example of an arrangement of a source driver 100 of the present embodiment.

The source driver 100 of the present embodiment includes a film substrate 107 as a base. An input terminal wiring region 101, an output terminal wiring region 102, and two heat conducting patterns 104 (third wiring line) are provided on the film substrate 107. The source driver 100 includes a semiconductor chip 105 on the film substrate 107. The film substrate 107 has two sprocket portions 103. The sprocket portions 103 are provided at opposite ends of the film substrate 107, respectively. That is, the source driver 100 is a semiconductor device of a film package type.

The input terminal wiring region 101 is a region in which wiring lines (first wiring lines) (not illustrated) are provided. The first wiring lines are connected to input terminals of the semiconductor chip 105, respectively. In a case where the input terminal wiring region 101 is viewed in a direction perpendicular to a surface of the semiconductor chip 105, which surface is attached to the film substrate 107, the input terminal wiring region 101 has a shape which extends wider from one of four side surfaces of the semiconductor chip 105 as being closer to a side (see an upper side of FIG. 1) where no sprocket portion 103 is provided.

The output terminal wiring region 102 is a region in which wiring lines (second wiring lines) (not illustrated) are provided. The second wiring lines are connected to output terminals of the semiconductor chip 105, respectively. In a case where the output terminal wiring region 102 is viewed in a direction perpendicular to the surface of the semiconductor chip 105, which surface is attached to the film substrate 107, the output terminal wiring region 102 has a shape which extends wider from a part other than the part in which the input terminal wiring region 101 is provided, as being closer to a side (see a lower side of FIG. 1) where no sprocket portion 103 is provided.

The sprocket portions 103 are provided at opposite ends of the source driver 100, respectively. The sprocket portions 103 are carrier members of a long carrier tape, which is to be cut so as to be individual source drivers 100. Specifically, a gear is fitted into a string of holes of each of the sprocket portions 103 so that the long carrier tape can be reeled in/out. This operation is carried out through processes, such as a process for providing wiring lines, an assembly process for providing a semiconductor chip, a chip capacitor, and the like, and a process for separating the source drivers. Each of the sprocket portions 103 is required to have such a strength that each of the sprocket portions 103 cannot be broken in the operation described above. In order to secure such a strength, each of the sprocket portions 103 includes a copper foil (metal portion) on the film substrate 107.

Each of the heat conducting patterns 104 is a wiring line for connecting a projecting terminal of the semiconductor chip 105 to the copper foil of the sprocket portion 103. The heat conducting pattern 104 is provided between the input terminal wiring region 101 and the output terminal wiring region 102 such that the heat conducting pattern 104 is insulated from both regions.

On the surface of the semiconductor chip 105, which surface faces the film substrate 107, a plurality of projecting terminals (metal bumps) are provided. Each of the terminals is connectable to an external member. The projecting terminals are made from a metal such as gold. The projecting terminals are categorized into: (i) an input terminal for receiving a signal, (ii) an output terminal for outputting a signal, and (iii) a physical terminal for dissipating heat, which physical terminal is not used to receive or output a signal. Among the terminals, the input terminals are connected to the wiring lines of the input terminal wiring region 101, respectively, and the output terminals are connected to the wiring lines of the output terminal wiring region 102, respectively. The physical terminals are connected to the heat conducting patterns 104, respectively. Note that the semiconductor chip 105 has approximately 720 outputs, for example.

According to the source driver 100 having the arrangement described above, the heat generated by the semiconductor chip 105 can be (i) dissipated from the semiconductor chip 105 itself, (ii) dissipated from the wiring lines themselves of the input terminal wiring region 101, (iii) led to the outside via the wiring lines of the input terminal line region 101, (iv) dissipated from the wiring lines themselves of the output terminal wiring region 102, and (v) led to the outside via the wiring lines of the output terminal line region 102. Further, the heat can be also dissipated from the heat conducting patterns 104, and dissipated from the sprocket portions 103 via the heat conducting patterns 104. Therefore, it becomes possible to increase a heat dissipation amount.

Further, in a conventional source driver 503, sprocket portions 515 are used only as carrier members, and are discarded after the source driver 503 is cut out. Further, through wiring regions 513 for receiving wiring lines for supplying a drive signal to the gate driver are provided. Among the through wiring regions 513, only those of the source drivers 503 at both ends of a side of a liquid crystal panel are in use.

On the other hand, the source driver 100 of the present embodiment employs the copper foils of the sprocket portions 103 which are not cut off but left, as portions for leading the heat to the outside of the semiconductor chip 105. The copper foils are connected to the heat conducting patterns 104, respectively. In the present embodiment, the through wiring regions 513 are not provided, which through wiring regions 513 are provided in the conventional source driver 503. Instead, in the present embodiment, the sprocket portions 103, used as the carrier members, are formed closer to an inner side by virtue of absence of the through wiring regions

513. This can reduce a width of the source driver 100, and also reduce cost of materials. For example, the conventional source driver 503 has a width of 48 mm, whereas the source driver 100 of the present embodiment has a width of 35 mm.

Alternatively, instead of reducing the width of the source driver 100, it is possible to allow the wiring lines to be rough-pitched by causing the input terminal wiring region 101 and the output terminal wiring region 102 to be larger, by virtue of the absence of the through wiring regions 513.

Further, areas which are necessary as the input terminal wiring region 101 and the output terminal wiring region 102 are determined in accordance with a position in which the semiconductor chip 105 is provided, and a layout of the projecting terminals (bump layout) of the semiconductor chip 105. In view of the heat dissipation property, it is preferable to provide the heat conducting patterns 104 as large as possible. Therefore, it is preferable that the bump layout of the semiconductor chip 105 is adjusted so as to allow a region between the input terminal wiring region 101 and the output terminal wiring region 102 to be larger, while the number of the projecting terminals is not reduced. This increases areas for conducting and dissipating the heat generated by the semiconductor chip 105. Accordingly, it becomes possible to increase the heat dissipation amount.

Figure 2:
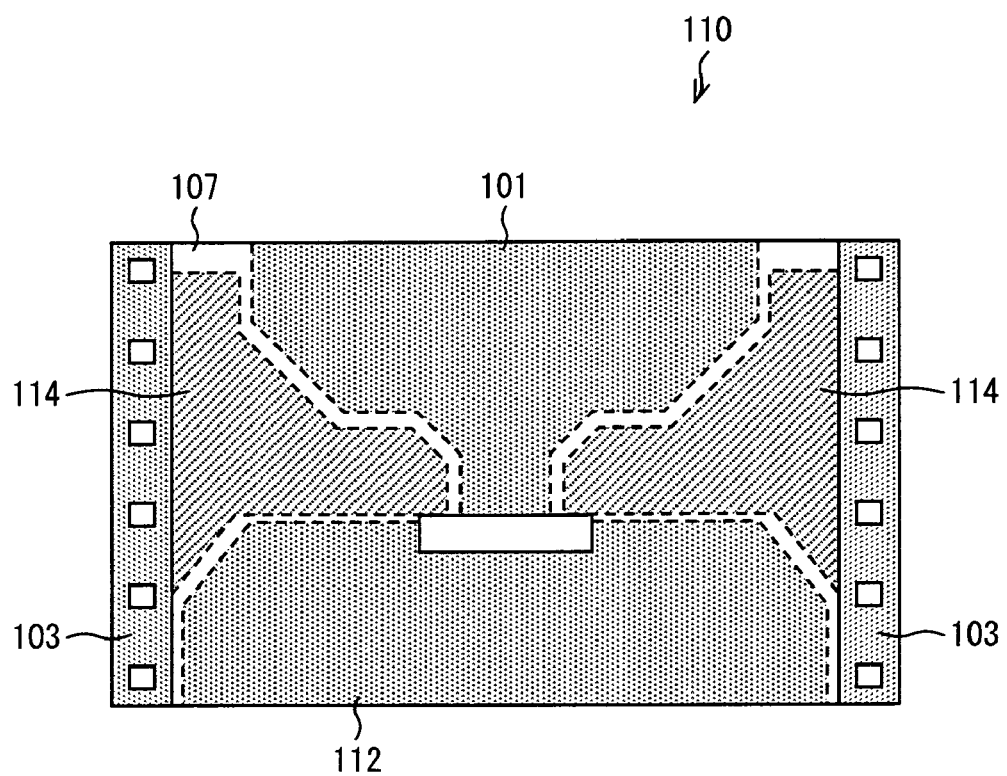
FIG. 2

FIG. 2 is a view illustrating an example of an arrangement of a source driver 110 in which the bump layout is adjusted on an output terminal side of the semiconductor chip 105.

As compared with the source driver 100 illustrated in FIG. 1, an output terminal wiring region 112 is formed to extend from three of four side surfaces of the semiconductor chip 105 in the source driver 110 illustrated in FIG. 2. Specifically, a direction in which each of outermost wiring lines among the wiring lines of the input terminal wiring region 101 is received by the semiconductor chip 105 (direction in which a part of each of the outermost wiring lines of the input terminal wiring region 101 extends, which part is connected to the input terminal of the semiconductor ship 105) is substantially perpendicular to a direction in which each of outermost wiring lines among the wiring lines of the output terminal wiring region 112 is received by the semiconductor chip 105 (a direction in which a part of each of the outermost wiring lines of the output terminal wiring region 112 extends, which part is connected to the output terminal of the semiconductor chip 105).

Further, the heat conducting patterns 114 are provided as large as possible between the input terminal wiring region 101 and the output terminal line region 112, while being insulated from both of the regions. This causes a region for dissipating the heat generated by the semiconductor chip 105 to be larger. Therefore, it becomes possible to easily dissipate the heat via the heat conducting patterns 114. Accordingly, it becomes possible to efficiently dissipate the heat. Note that the heat conducting patterns 114 and the copper foils of the sprocket portions 103 may be integral with each other.

(Method for Manufacturing Source Driver)

Next, the following description deals with a method for manufacturing the source driver 100 of the present embodiment.

Figure 3:
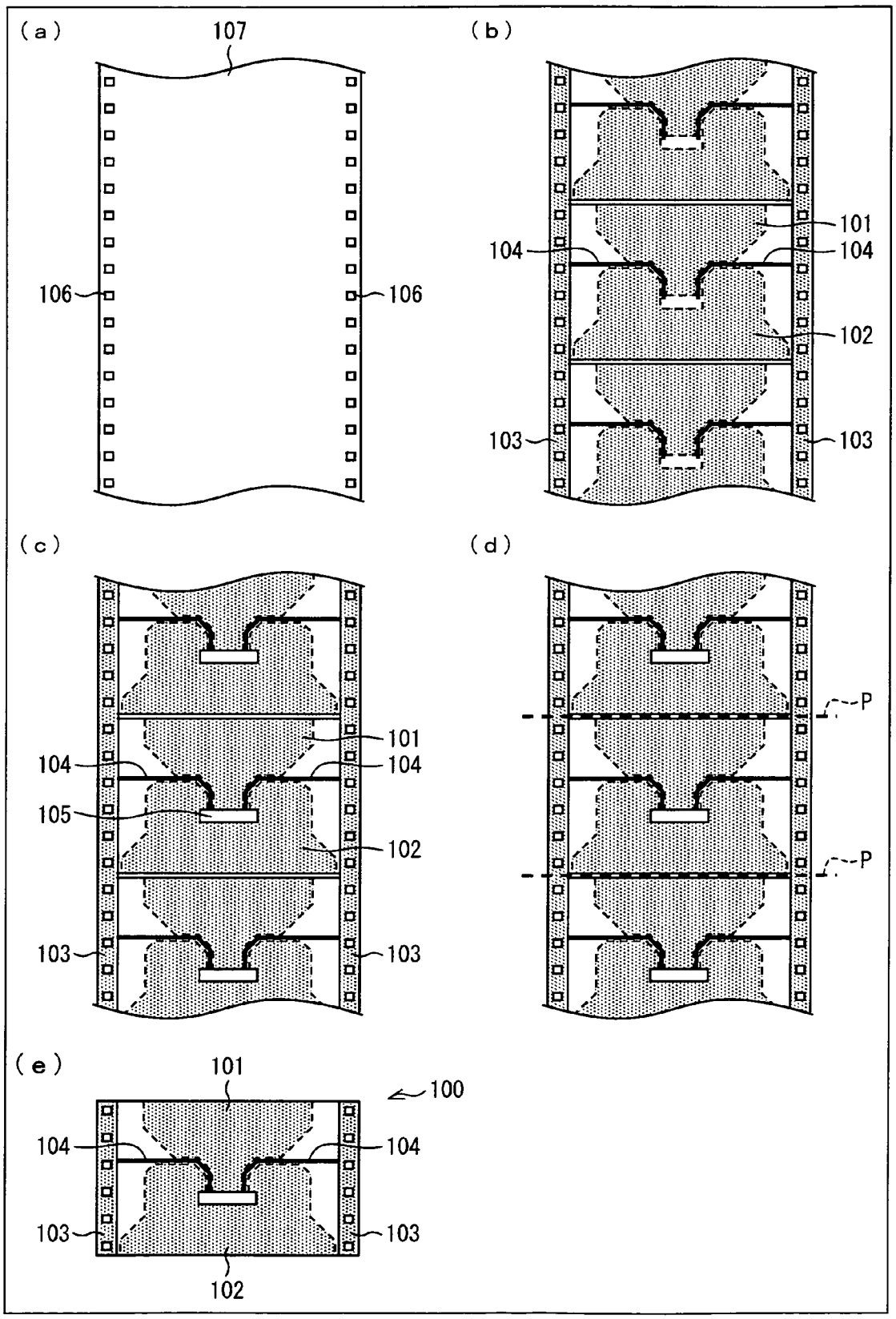
FIG. 3

FIG. 3 is a flow diagram illustrating a flow of manufacturing the source driver 100 of the present embodiment. Each of (a) through (e) of FIG. 3 illustrates a step in the flow. Note that the source driver 100 is manufactured by a reel-to-reel method.

First, the film substrate 107 having a long carrier tape shape is prepared. The film substrate 107 is to be a base of the source driver 100 (see (a) of FIG. 3). Then, a string of holes 106 are formed in each of regions of the film substrate 107, which regions are located at ends of the film substrate 107 in a width direction. The string of holes 106 are formed in a longitudinal direction of the film substrate 107. Note that the film substrate 107 is an insulating film made from an organic resin material (such as polyimide or the like).

Next, the wiring lines of the input terminal wiring region 101, the wiring lines of the output terminal wiring region 102, the copper foils of the sprocket portions 103, and the heat conducting patterns 104 are provided (see (b) of FIG. 3). Specifically, a surface of the film substrate 107 is subjected to copper plating. Then, the surface is further subjected to resist coating, an exposure process, and a development process. After that, etching is carried out. Thereby a pattern of each of the regions is formed. Remaining copper is subjected to tin plating, so that each of the regions is provided. This makes it possible to provide all of the regions together at one time. Further, these regions are provided repeatedly (continuously) in the longitudinal direction as the pattern of the source driver 100.

Note that one end of each of the wiring lines of the input terminal wiring region 101 is connected to the semiconductor chip 105, and the other end of each of the wiring lines of the input terminal wiring region 101 extends in the longitudinal direction of the film substrate 107, and one end of each of the wiring lines of the output terminal wiring region 102 is connected to the semiconductor chip 105, and the other end of each of the wiring lines of the output terminal wiring region 102 extends in a direction opposite to the longitudinal direction. Further, the wiring lines of the input terminal wiring region 101, the wiring lines of the output terminal wiring region 102, and the heat conducting patterns 104 are coated with a solder resist except regions of outer leads used by a user as connection portions, and regions of inner leads for receiving the semiconductor chip.

Next, the semiconductor chip 105 is provided for every pattern continuously (see (c) of FIG. 3). Specifically, the projecting terminals of the semiconductor chip 105 and the tin plated wiring lines are attached to each other by heat and pressure on the film substrate 107, so as to be subjected to gold-tin eutectic bonding. Thereby, the semiconductor chip 105 is fixed onto the film substrate 107. Generally, the step for connecting the semiconductor element to the substrate is called "Inner Lead Bonding (ILB)". After the ILB, narrow spaces between the semiconductor chip and the tape substrate are filled with an underfill material, i.e. a solventless epoxy resin. Then the underfill resin is subjected to a curing process.

Next, the film substrate 107 is cut along a cut surface P (see (d) of FIG. 3). The cut surface P is set along the width direction of the film substrate 107 so that the film substrate 107 is cut without any influences on the source drivers which have been formed continuously. Therefore, individual source drivers 100 can be manufactured (see (e) of FIG. 3). The source driver 100 has a substantially rectangular shape.

Figure 9:
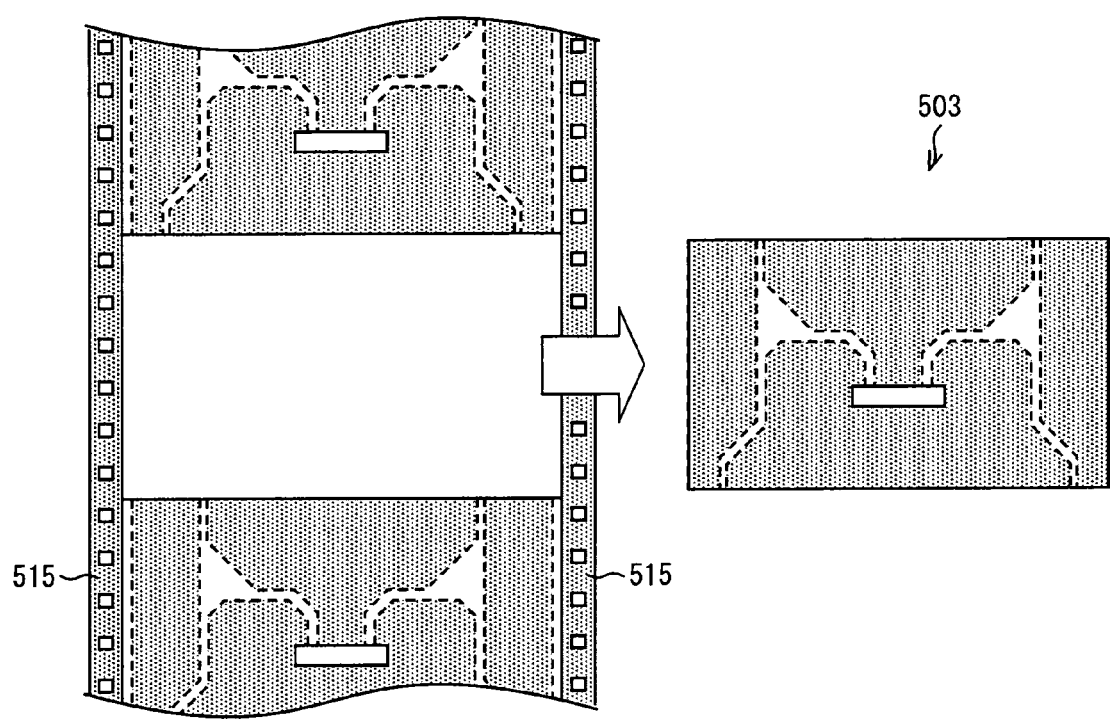
FIG. 9

Conventionally, individual source drivers 503 are cut out by use of a metallic mold (see FIG. 9). However, the individual source drivers 100 of the present embodiment are manufactured by not cut out from the film substrate 107 but cutting the film substrate 107 along a straight line. Since the source driver 100 can be manufactured by only cutting the film substrate 107 in a certain direction, it is possible to use a reasonable metallic mold for the cutting. Further, the sprocket portions 103 have been discarded conventionally, but in the source driver 100, the sprocket portions 103 are kept and used as the heat dissipating portions.

In the above description, the wiring lines of the input terminal wiring region 101, the wiring lines of the output terminal wiring region 102, the copper foils of the sprocket portions 103, and the heat conducting patterns 104 are provided together at one time. However, the copper foils of the sprocket portions 103 may be formed separately from the other patterns. That is, a metal, such as stainless steel (SUS), may be provided on the surface of the film substrate 107 so as to cause the sprocket portions 103 to function as the heat dissipating bodies, before or after the wiring lines of the input terminal wiring region 101, the wiring lines of the output terminal wiring region 102, and the heat conducting patterns 104 are formed. This allows the heat conducted to the sprocket portions 103 via the heat conducting patterns 104 to be efficiently dissipated from the sprocket portions 103. Therefore, it becomes possible to increase the heat dissipation amount.

Note that the source driver 100 thus manufactured is applicable to any of a TCP, a COF, and an SOF (System on Film).

Further, in the aforementioned method for manufacturing the source driver 100, (i) the film substrate 107 is processed to have the holes 106, and then (ii) patterns of: the wiring lines of the input terminal wiring region 101; the wiring lines of the output terminal wiring region 102; the copper foils of the sprocket portions 103; and the heat conducting patterns 104 are formed (see (a) and (b) of FIG. 3). However, the present invention is not limited to this. That is, the method may be such that (i) the patterns of: the wiring lines of the input terminal wiring region 101; the wiring lines of the output terminal wiring region 102; the copper foils of the sprocket portions 103; and the heat conducting patterns 104 are formed, and then (ii) the holes 106 are formed.

Embodiment 2

Another embodiment of the present invention is described below with reference to drawings. Note that an arrangement of the present embodiment is the same as the arrangement of Embodiment 1 except arrangements described below. Further, members having the same functions as those of the members illustrated in the drawings referenced in Embodiment 1 have the same signs, and explanations of these are omitted, for the sake of simple explanation.

Figure 4:
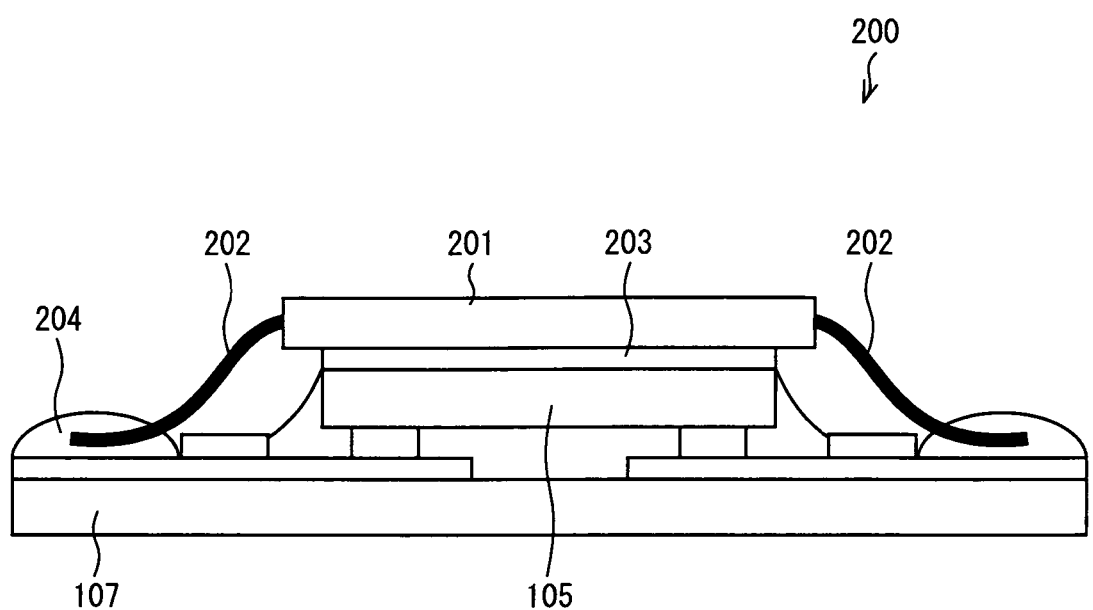
FIG. 4

FIG. 4 is a cross-sectional side view illustrating an example of an arrangement of a source driver 200 of the present embodiment.

The source driver 200 of the present embodiment is such that the source driver 100 of Embodiment 1 further includes a heat dissipating material 201 attached to an upper surface of a semiconductor chip 105 with the use of an adhesive agent 203, which heat dissipating material 201 has suspender leads 202 (see FIG. 4).

The heat dissipating material 201 is a metal plate (heat spreader), and may be selected from various kinds of metal in accordance with cost and heat conductivity. A size of the heat dissipating material 201 can be determined arbitrarily in accordance with a size of the semiconductor chip 105. A height (thickness) of the heat dissipating material 201 is determined in accordance with a thickness of the semiconductor chip 105, and a height limit of a whole product. The height of the heat dissipating material 201 is also determined so as to obtain appropriate heat dissipation efficiency.

Further, the heat dissipating material 201 has at least two suspender leads 202. The suspender leads 202 are attached to side surfaces of the heat dissipating material 201, respectively, so as to hang down from the side surfaces. The suspender leads 202 are connected to heat conducting patterns 104 by solders 204, respectively. Further, the suspender leads 202 are made of a metal, and can be integral with the heat dissipating material 201. Note that the heat dissipating material 201 having the suspender leads 202 can be a lead frame included in a conventional mold package. This makes it possible to provide a reasonable product.

Conventionally, heat dissipation from a semiconductor chip 105 itself to the atmosphere has not been sufficient in amount due to a significantly low heat conductivity in a dry atmosphere. Meanwhile, the source driver 200 includes the heat dissipating material 201 which provides a path through which the heat generated by the semiconductor chip 105 is led to the atmosphere via the heat dissipating material 201. Furthermore, the heat dissipating material 201 and the heat conducting patterns 104 are connected by the suspender leads 202. This provides another path through which the heat generated by the semiconductor chip 105 is led from the heat dissipating material 201 to sprocket portions 103 via the suspender leads 202 and the heat conducting patterns 104.

Therefore, it becomes possible to efficiently dissipate the heat generated due to an electrical operation of the semiconductor chip 105, from an exposed surface of the semiconductor chip 105 (a surface opposite to projecting terminals of the semiconductor chip 105, which projecting terminals face the substrate). Accordingly, it becomes possible to increase the heat dissipation amount.

Further, the heat dissipating material 201 may be attached to the semiconductor chip 105 via the adhesive agent 203 in advance. Then, the semiconductor chip 105 having the heat dissipating material 201 is provided on the film substrate 107 by the ILB. This makes it possible to simplify a complicated step in a manufacturing process.

Embodiment 3

Further another embodiment of the present invention is described below with reference to drawings. Note that an arrangement of the present embodiment is the same as the arrangements of Embodiments 1 and 2, except arrangements described below. Further, members having the same functions as those of the members illustrated in the drawings referenced in Embodiments 1 and 2 have the same signs, and explanations of these are omitted, for the sake of simple explanation.

Figure 5:
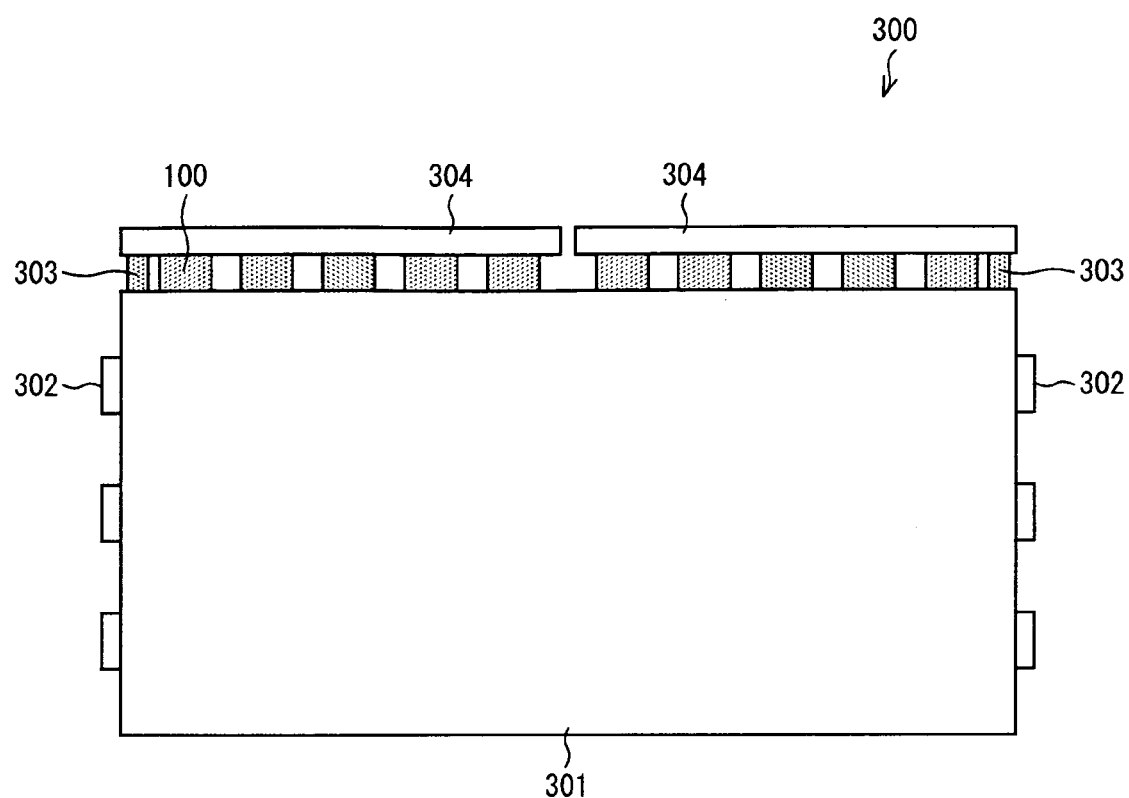
FIG. 5

FIG. 5 is a view illustrating an example of an arrangement of a liquid crystal module 300 of the present embodiment.

The liquid crystal module 300 of the present embodiment includes a liquid crystal panel 301, gate drivers 302, wiring tapes 303, input substrates 304, and source drivers 100 of Embodiment 1 (see FIG. 5). To one of four sides of the liquid crystal panel 301, 10 source drivers 100 are attached, and 3 gate drivers 302 are attached to each of opposite two sides of the four sides, which two sides are perpendicular to the side to which the source drivers 100 are attached. The input substrates 304 attached to the source drivers 100 so as to be opposite to the liquid crystal panel 301 with respect to the source drivers 100. Further, a signal output of the input substrate 304 is controlled by a control section (not illustrated) or the like.

Figure 6:
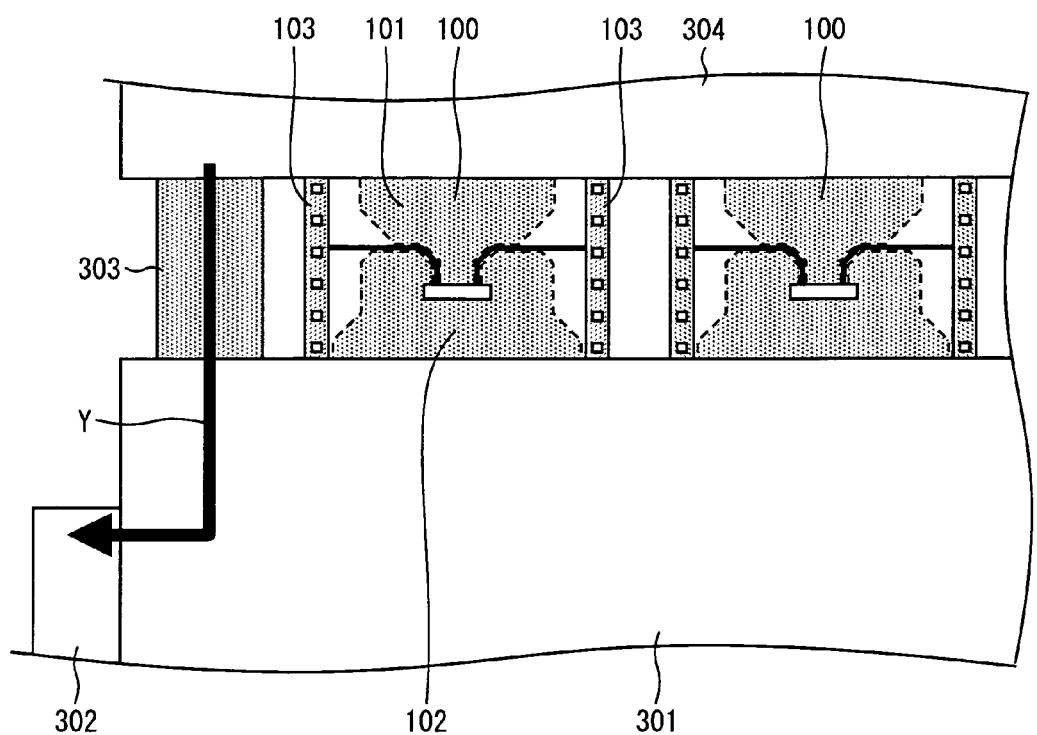
FIG. 6
Figure 7:
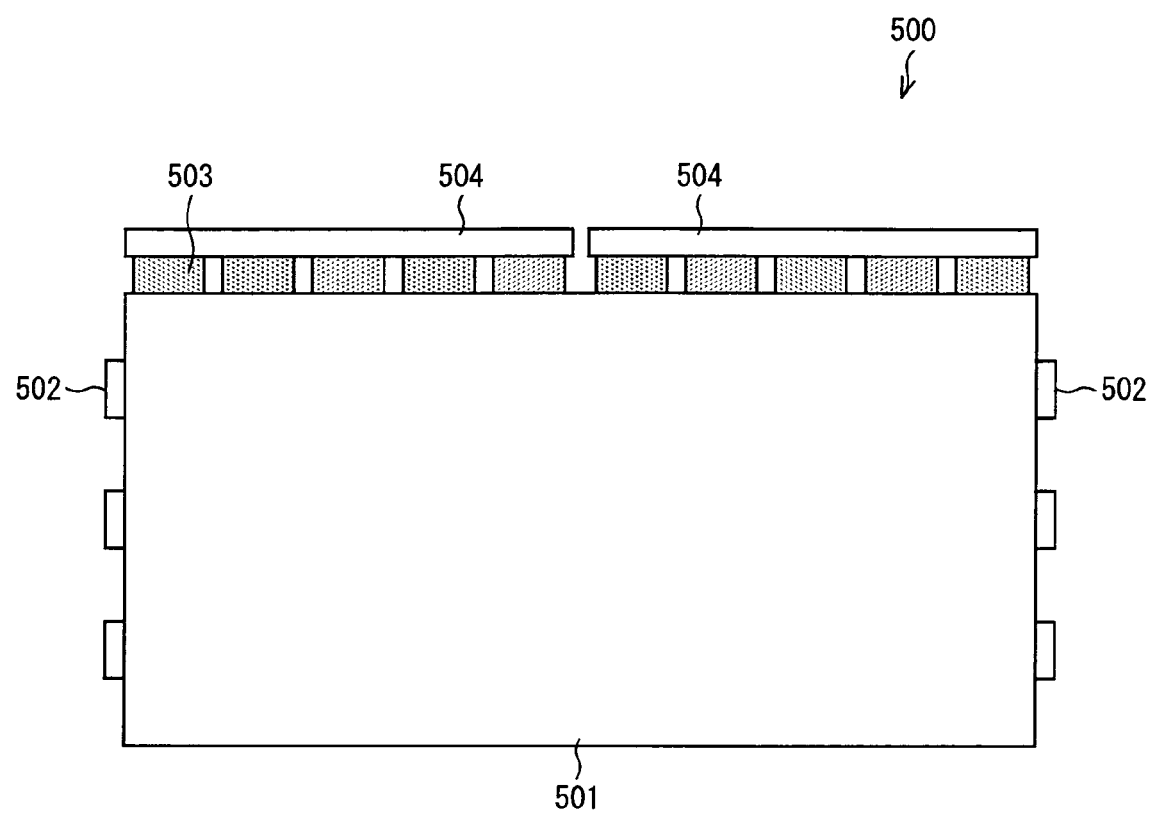
FIG. 7
Figure 8:
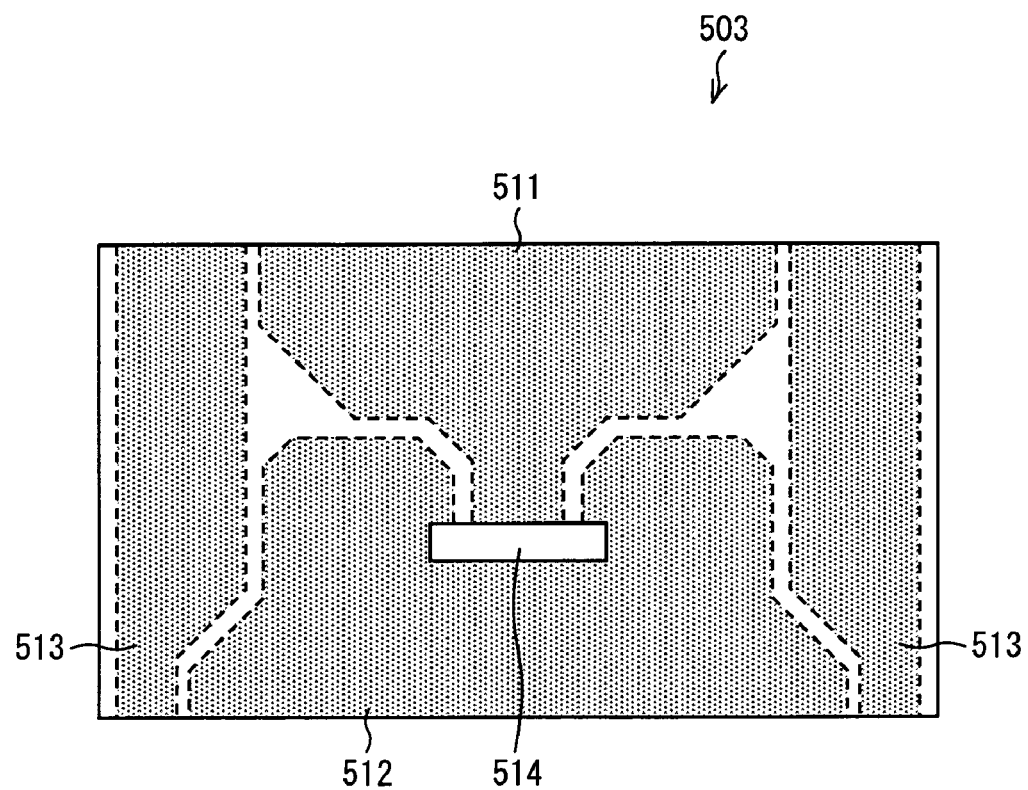
FIG. 8

The source driver 100 is such that a side adjacent to an input terminal wiring region 101 is pressure-bonded to the input substrate 304, and a side adjacent to an output terminal wiring region 102 is pressure-bonded to the liquid crystal panel 301 (see FIG. 6). Further, an output side of the gate driver 302 is pressure-bonded to the liquid crystal panel 301. Note that the number of the source drivers 100 and the number of the gate drivers 302 are not limited to those described above. The number of the source drivers 100 and the number of the gate drivers 302 may be determined appropriately in accordance with the number of scan lines of the liquid crystal panel 301, and the number of outputs of the driver.

The wiring tape 303 is a film tape on which wiring lines for supplying a drive signal to the gate drivers 302 are provided. One end of the wiring tape 303 is pressure-bonded to the liquid crystal panel 301, and the other end of the wiring tape 303 is pressure-bonded to the input substrate 304.

With the arrangement, the gate driver 302 and the source driver 100 receive a drive signal and a power source from the wiring lines provided on the input substrates 304. Thereby, the liquid crystal panel 301 is driven. That is, in the liquid crystal module 300, the gate driver 302 receives a drive signal and the power source from the input substrate 304 via the wiring tape 303 and the liquid crystal panel 301 (see an arrow Y in FIG. 6), as illustrated in FIG. 6.

Figure 10:
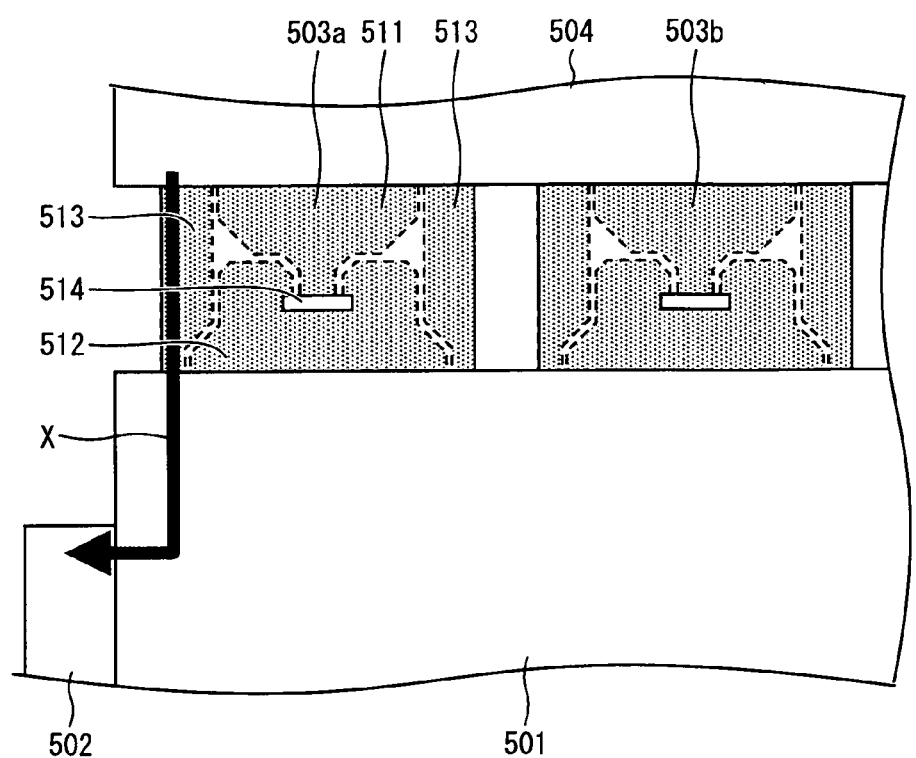
FIG. 10

Conventionally, a gate drivers 502 receives a drive signal and the power source from an input substrate 504 via wiring lines provided in a through line region 513 of a source driver 503 (see FIG. 10). However, in the liquid crystal module 300 of the present embodiment, the gate drivers 302 receives a drive signal and the power source from the input substrate 304 via the wiring tape 303 (see FIG. 6). Therefore, the wiring tape 303 of the present embodiment allows a simple wiring arrangement with a constant pitch, without having a conventional problem that wiring lines often have partially a narrow pitch due to a shape of the through line region 513.

Accordingly, absence of the wiring lines for supplying a drive signal to the gate driver 302 has no influence on the liquid crystal module 300. On the contrary, there are spaces for receiving the wiring tapes 303 on the side of the liquid crystal panel 301 due to a reduction in width of each of the source drivers 100. Therefore, even if the liquid crystal panel 301 is the same in size and in the number of the source drivers as a conventional liquid crystal panel, it is possible to attach the wiring tapes 303 to the liquid crystal panel 301. Accordingly, although there is an increase in the number of components of the liquid crystal module 300 due to the addition of the wiring tapes 303, it is possible to have a reduction in total cost of the liquid crystal module 300 of the present embodiment due to a reduction in cost of the source drivers 100, and the like.

Further, in the present embodiment, in addition to conventional paths for dissipating the heat generated by the semiconductor chip 105 of the source driver 100, it is possible to lead the heat to the liquid crystal panel 301 and the input substrate 304 via the heat conducting patterns 104 and the sprocket portions 103. Therefore, it becomes possible to realize a liquid crystal module which is advantageous in heat dissipation property.

In the above description, the liquid crystal module 300 includes the source drivers 100. Note however that the present invention is not limited to this, and the liquid crystal module 300 may include source drivers 110 and source drivers 200. In this case, it becomes possible to increase the heat dissipation property of the liquid crystal module 300 more greatly.

The present invention is not limited to the description of the embodiments above, but may be altered by a skilled person within the scope of the claims. An embodiment based on a proper combination of technical means disclosed in different embodiments is encompassed in the technical scope of the present invention.

INDUSTRIAL APPLICABILITY

The present invention is suitably applicable to a field in regard to a source driver of a film package type, which source driver is required to have an improvement in its heat dissipation amount. Further, the present invention is suitably applicable to a field in regard to manufacture of the source driver. Furthermore, the present invention is widely applicable to a field of a liquid crystal module including the source driver.

The invention claimed is:

1. A source driver of a film package type, comprising:
a film substrate;
a semiconductor chip provided on a surface of the film substrate, the semiconductor chip having a plurality of terminals each of which is connectable to an external member, the plurality of terminals including first terminals for receiving an electric signal, second terminals for outputting an electric signal, and third terminals;
first wiring lines provided on the surface of the film substrate, the first wiring lines being connected to the first terminals, respectively;
second wiring lines provided on the surface of the film substrate, the second wiring lines being connected to the second terminals, respectively; and
sprocket portions provided at opposite sides of the film substrate, respectively, each of the sprocket portions having a metal portion on the film substrate, and a string of holes,
each of the first wiring lines being provided such that one end of each of the first wiring lines is connected to the first terminal, and the other end of each of the first wiring lines extends to a side where no sprocket portion is provided, each of the second wiring lines being provided such that one end of each of the second wiring lines is connected to the second terminal, and the other end of each of the second wiring lines extends to a side opposite to said side to which the other end of each of the first wiring lines extends,
the source driver further comprising:
third wiring lines for connecting the third terminals, each of which is connected to neither any one of the first wiring lines nor any one of the second wiring lines, to the metal portions of the sprocket portions, respectively, the third wiring lines being provided on the surface of the film substrate.

2. The source driver as set forth in claim 1, wherein:
each of the sprocket portions is such a heat dissipating body that copper or stainless steel is provided on the surface of the film substrate.

3. The source driver as set forth in claim 1, wherein:
the third wiring lines are provided over a whole region between outermost first wiring lines among the first wiring lines and outermost second wiring lines among the second wiring lines such that the third wiring lines are electrically insulated from the outermost first wiring lines and the outermost second wiring lines.

4. The source driver as set forth in claim 3, wherein:
the metal portions of the sprocket portions and the third wiring lines are integral with each other.

5. The source driver as set forth in claim 3, wherein:
a direction in which each of the outermost first wiring lines extends to be connected to the first terminal of the semiconductor chip is substantially perpendicular to a direction in which each of the outermost second wiring lines extends to be connected to the second terminal of the semiconductor chip.

6. The source driver as set forth in claim 1, the source driver further comprising:
a metal plate on an upper surface of the semiconductor chip, the metal plate having suspender leads,
the suspender leads being connected to the third wiring lines, respectively.

7. The source driver as set forth in claim 1, wherein:
the source driver is manufactured in such a manner that (i) source drivers are prepared as a long carrier tape having the sprocket portions at opposite sides of the long carrier tape, respectively, the opposite sides facing each other in a width direction of the long carrier tape, and then (ii) the long carrier tape is cut in the width direction so as to be divided into individual source drivers.

8. A method for manufacturing a source driver of a film package type, the source driver including:
a film substrate;
a semiconductor chip provided on a surface of the film substrate, the semiconductor chip having a plurality of terminals each of which is connectable to an external member, the plurality of terminals including first terminals for receiving an electric signal, second terminals for outputting an electric signal, and third terminals;
first wiring lines provided on the surface of the film substrate, the first wiring lines being connected to the first terminals, respectively; and
second wiring lines provided on the surface of the film substrate, the second wiring lines being connected to the second terminals, respectively,
the method comprising:
(a) providing the following (i) through (iv) at one time, on a surface of a long carrier tape-shaped film substrate, and repeating the providing continuously: (i) the first wiring lines such that one end of each of the first wiring lines extends in a longitudinal direction of the long carrier tape-shaped film substrate, which end is not to be connected to the first terminal; (ii) the second wiring lines such that one end of each of the second wiring lines extends in a direction opposite to the longitudinal direction, which end is not to be connected to the second terminal; (iii) metal portions at both sides of the surface of the long carrier tape-shaped film substrate; and (iv) third wiring lines for connecting third terminals of the semiconductor chip to the metal portions, the third terminals being connected to neither any one of the first wiring lines nor any one of the second wiring lines;
(b) providing the semiconductor chip so that the semiconductor chip is connected to the first wiring lines and the second wiring lines, and repeating the providing continuously; and
(c) cutting the long carrier tape-shaped film substrate in the width direction so as to divide the long carrier tape-shaped film into individual source drivers.

9. The method as set forth in claim 8, wherein:
a metal plate having suspender leads is provided on one of surfaces of the semiconductor chip; and
said step (b) includes: providing the semiconductor chip on the surface of the film substrate such that said one of surfaces is provided as an upper surface; and then connecting the suspender leads to the third wiring lines, respectively.

10. A liquid crystal module comprising:
a liquid crystal panel;
a plurality of source drivers being attached to one side or two sides facing each other, among four sides of the liquid crystal panel;
a plurality of gate drivers attached to one side or two sides perpendicular to said one side or two sides facing each other, to which the plurality of source drivers are attached, among the four sides of the liquid crystal panel;
a substrate or substrates connected to the plurality of source drivers; and
a wiring tape or wiring tapes for connecting the liquid crystal panel to the substrate or substrates, the wiring tape or wiring tapes being provided at an end or ends of the side or two sides to which the plurality of source drivers are attached, the wiring tape or wiring tapes being provided closer to the one side or two sides to which the plurality of the gate drivers are provided, than the plurality of source drivers,
each of the plurality of source drivers being of a film package type,
each of the plurality of source drivers including:
a film substrate;
a semiconductor chip provided on a surface of the film substrate, the semiconductor chip having a plurality of terminals each of which is connectable to an external member, the plurality of terminals including first terminals for receiving an electric signal, second terminals for outputting an electric signal, and third terminals;
first wiring lines provided on the surface of the film substrate, the first wiring lines being connected to the first terminals, respectively;
second wiring lines provided on the surface of the film substrate, the second wiring lines being connected to the second terminals, respectively; and
sprocket portions provided at opposite sides of the film substrate, respectively, each of the sprocket portions having a metal portion on the film substrate, and a string of holes,
each of the first wiring lines being provided such that one end thereof is connected to the first terminal, and the other end of each of the first wiring lines extends to a side where no sprocket portion is provided, each of the second wiring lines being provided such that one end of each of the second wiring lines is connected to the second terminal, and the other end of each of the second wiring lines extends to a side opposite to said side to which the other end of each of the first wiring lines extends,
each of the plurality of source drivers further including:
third wiring lines for connecting the third terminals, each of which is connected to neither any one of the first wiring lines nor any one of the second wiring lines, to the metal portions of the sprocket portions, respectively, the third wiring lines being provided on the surface of the film substrate.

* * * * *